United States Patent

Hino et al.

[11] Patent Number: 5,848,465
[45] Date of Patent: Dec. 15, 1998

[54] METHOD FOR FABRICATION OF PROBE

[75] Inventors: Atsushi Hino; Shoji Morita; Masakazu Sugimoto, all of Ibaraki, Japan

[73] Assignee: Nitto Denko Corporation, Osaka, Japan

[21] Appl. No.: 740,385

[22] Filed: Oct. 29, 1996

[30] Foreign Application Priority Data

Oct. 30, 1995 [JP] Japan .................................. 7-282067

[51] Int. Cl.⁶ .................................................. H05K 3/06
[52] U.S. Cl. .............................. 29/825; 29/447; 29/448; 29/846; 324/757
[58] Field of Search ........................... 29/825, 449, 447, 29/448, 423, 846; 156/84, 108, 307.1; 174/254, 255, 524; 324/754, 757, 761, 760

[56] References Cited

U.S. PATENT DOCUMENTS 4,647,851  3/1987  Dugan .
5,030,318  7/1991  Reche .
5,225,037  7/1993  Elder et al. .............................. 156/664

FOREIGN PATENT DOCUMENTS 0333160A    9/1989  European Pat. Off. .
0484141A    5/1992  European Pat. Off. .
07231019    8/1995  Japan .
WO9306496A  4/1993  WIPO .

Primary Examiner—Carl E. Hall
Attorney, Agent, or Firm—Sughrue, Mion, Zinn, Macpeak & Seas, PLLC

[57] ABSTRACT

A method for fabrication of a probe includes the steps of: (1) forming a structure wherein a contact part formed on one side of an insulating flexible substrate and a conductor formed on either side or the inside of the flexible substrate are electrically continued, and (2) joining the flexible substrate and a rigid frame substrate capable of supporting the tension in the planar direction of the flexible substrate at the outer periphery thereof, by bonding them by lamination pressing after heating, or by heating after lamination pressing, thereby applying a planar tension to the flexible substrate enclosed by the rigid substrate.

8 Claims, 5 Drawing Sheets

METHOD FOR FABRICATION OF PROBE

FIELD OF THE INVENTION

The present invention relates to a method for fabrication of sheet probe structures (hereinafter "probe") for determination of various electric performances and circuit testing of small test objects, particularly testing at high temperatures such as burn-in test.

BACKGROUND OF THE INVENTION

Along with the development of miniaturized and multifunctional electronic devices in recent years it has become desirable that, semiconductor elements that are to be mounted thereon have a smaller size. Additionally, it has become desirable to minimize the mounting area of the semiconductor element to the greatest possible extent. In to these demands bare chip mounting has been employed, wherein semiconductor elements are mounted without packaging after formation in plurality on a silicon wafer or upon parting in smaller units (hereinafter semiconductor elements in this stage will be referred to as bare chips). This mode of mounting is rapidly prevailing. Even mounting with a wafer will be practiced in the near future. Therefore, various quality determinations and testing of semiconductor elements, particularly testing at high temperatures such as in a burn-in test, should be conducted on bare chips or pre-bare chips (i.e. on-wafer or stage products).

Small test objects such as bare chips and wafers contain elaborately formed contact targets such as electrodes and conductors. However electric contact targets are most preferably made by a sheet probe. Such sheet probes generally contain a contact part formed on one side of an insulating flexible substrate and a circuit pattern formed on either the side or inside of said flexible substrates since they are electrically continued. The contact part is a point where electric contact is made with respect to its contact target. Generally it is protruding metal conductor known as a bump contact, or simply a bump.

A burn-up test is performed at temperatures ranging from 120° C. to 150° C. and occasionally temperatures up to 200° C. When it is subjected to a burn-in test, a probe manufactured by a conventional method is susceptible to contact failure or checkout failure as a result of a dislocation of a bump contact of the probe after the temperature rise. Although the bump contact was originally in contact with the contact target on a test object at room temperature at the beginning of the test, significantly different coefficients of linear expansion between the test object and the probe cause a dislocation of the bump contact. Thus, the reliability of the probe as a test tool is impaired.

When the dislocation of the bump contact of the probe is not large enough to avoid the contact target, the bump contact is drawn for several dozens of microns while being in contact with the contact object. This produces flaws on the contact target which degrades its product value. In other words, the bump contact may be damaged by the contact target, thus shortening its service life as a test tool.

It is therefore an object of the present invention to solve the above-mentioned problems and provide a method for fabrication of a probe that works well at high temperatures, such as in a burn-in test, has high contact reliability, and which is superior in durability as a test tool.

SUMMARY OF THE INVENTION

The fabrication method of the present invention is characterized by a step (1) for forming a structure wherein a contact part formed on one side of an insulating flexible substrate and a conductor formed on either side or the inside of said flexible substrate are electrically continued, and a step (2) for joining said flexible substrate and a rigid frame substrate capable of supporting tension in the planar direction of said flexible substrate at the outer periphery thereof, by bonding them by a lamination process after heating, or by heating after the lamination process, thereby applying planar tension to the flexible substrate enclosed by the rigid substrate.

DETAILED DESCRIPTION OF THE INVENTION

Figure 1:
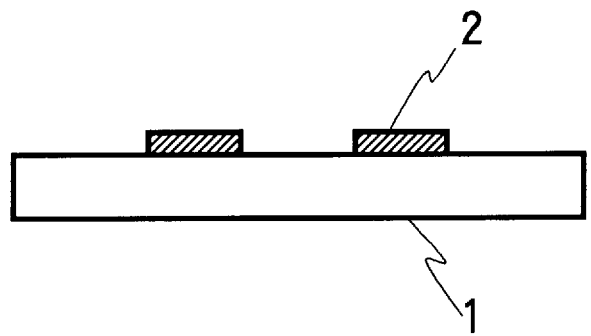
FIG. 1(a), FIG. 1(b) and FIG. 1(c) schematically show one example of fabrication of the probe of the present invention.
Figure 1:
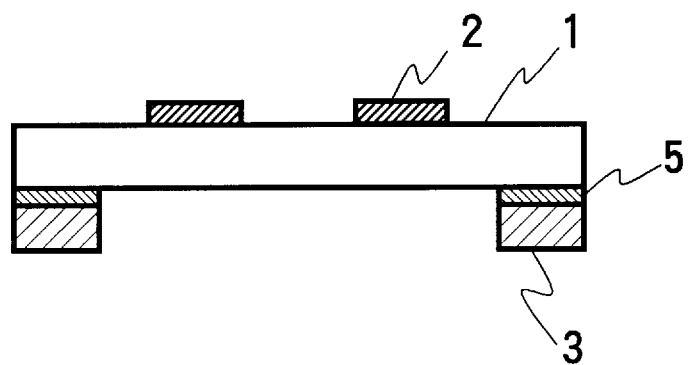
Figure 1:
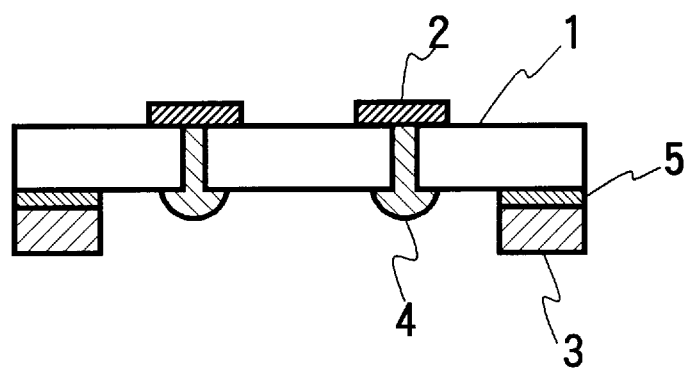

In the present invention, an important step is bonding a rigid frame substrate to the flexible substrate by heating and lamination press, thereby applying tension to the flexible substrate. This enables fabrication of a probe wherein the flexible substrate is stretched relative to the rigid frame substrate. The tension is a difference in the amount of expansion between the rigid substrate and the flexible substrate, or a difference in the amount of shrinkage upon heating, as described in detail in the following sections (1) and (2).

(1) When a material showing greater thermal expansion than the rigid substrate is used as a material for the flexible substrate, the flexible substrate and the rigid substrate are first heated to cause expansion, and then bonded by a lamination press. By cooling to room temperature from this heated state, the flexible substrate shrinks more than the rigid which, and causes tension. Further, the rigid substrate may not expand by heating. Instead, the rigid substrate may shrink. The bonding between the flexible substrate and the rigid substrate may become complete simultaneously with lamination, by cooling after lamination, or at a time thereafter. The lamination press is preferably continued until the bonding is complete.

(2) When a material that is incapable of restoring to its original size after shrinking and has a greater thermal shrinkage than the rigid substrate is used as a material for the flexible substrate, the flexible substrate and the rigid substrate are first bonded by a lamination press before heating, and then heated to the shrinkage temperature. In this method, the tension that occurs upon heating remains after cooling the substrates to room temperature. Again, the lamination press is preferably maintained until the bonding becomes complete.

By preparing a probe by method (1) or (2) mentioned above, the flexible substrate can be easily stretched relative to the rigid frame substrate. The flexible substrate that is stretched relative to the rigid frame substrate is free of any noticeable dislocation of the contact part of the probe from the contact target. Even under expansion at high temperatures such as in a burn-in test, the contact part of the probe and the contact target remain in contact because variation in the amount of expansion is absorbed by the variation in tension thus imparted.

In either (1) or (2) above, a material showing expansion at a temperature higher than 200° C. or a material adapted to shrink at a temperature higher than 200° C. is preferably used for both the flexible substrate and rigid Substrate. These substrates are heated and bonded by a lamination press. By preparing the substrates under the above-described conditions of fabrication, the above-mentioned effect can also be achieved in a burn-in test where the temperature reaches 200° C., by preparing the is shown. In this fabrication method, substrates under the fabrication conditions stated.

The linear expansion coefficient of the material used as the rigid substrate is chosen to intentionally cause dislocation of the contact target a desired distance from the probe contact. A certain combination of the probe and test substrate results in the penetration of an oxide film formed on the surface of the contact target, thus ensuring more preferable contact performance.

In FIG. 1, one example of the fabrication method of the present invention shown. In this fabrication method, the conductor is a circuit pattern, and bump contacts are formed at the end of the fabrication process. FIG. 1 illustrates a section of a product and only the lines visible in the section as shown.

FIG. 1(a) is a step for forming a circuit pattern 2 (conductor) on a flexible substrate 1.

FIG. 1(b) is a step for joining the flexible substrate 1 and a rigid substrate 3 by heating and lamination press to apply tension to the flexible substrate. In this embodiment, an adhesive layer 5 is interposed between the flexible substrate and the rigid substrate. As mentioned above, when a material showing a greater thermal expansion than the rigid substrate is used as a material for the flexible substrate, the flexible substrate and the rigid substrate are first heated to cause expansion, and then bonded by a lamination press. When a material showing a greater thermal shrinkage than the rigid substrate is used as a material for the flexible substrate, the flexible substrate and the rigid substrate are bonded by a lamination press before heating. The flexible substrate and rigid substrate are then heated to the shrinkage temperature and joined.

FIG. 1(c) shows a step for forming a bump contact 4 which becomes a contact part.

The material used for the flexible substrate may be any as long as it has an electric insulating property, flexibility, and shows greater expansion or shrinkage than the rigid substrate upon heating.

Specific examples of the material that expands upon heating include polyester resin, epoxy resin, urethane resin, polystyrene resin, polyethylene resin, polyamide resin, polyimide resin, ABS resin, polycarbonate resin, silicone resin, fluororesin and the like, which may be thermosetting or thermoplastic. Polyimide resin that expands at a temperature higher than 200° C. and shows a superior insulating property is particularly preferred.

Of the materials for the flexible substrate, an example of a suitable material that shrinks upon heating is, a material that has a glass transition temperature that is higher than atmospheric temperature and which has undergone drawing treatment at ambient temperature. Such a material shrinks to the glass transition temperature upon heating as a result of the release of stress. In particular, a material having a glass transition temperature higher than 200° C. can with stand burn-in tests at high temperatures and is preferably used.

Tension can be applied to a flexible substrate prepared from a thermosetting resin that shrinks as curing progresses progression of curing, by maintaining the semi-cured state of the resin material, and heating to completely cure the resin, after bonding the flexible substrate to a rigid substrate by a lamination press. This causes tension due to shrinkage of the flexible substrate. Alternatively, a resin containing a solvent is heated to a temperature higher than the boiling point of the solvent to evaporate said solvent, and the flexible substrate is allowed to shrink, thus causing tension.

Figure 2:
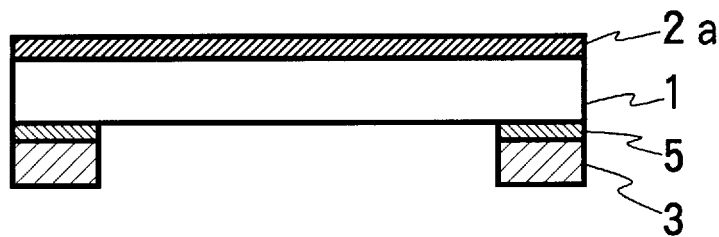
FIG. 2(a), FIG. 2(b) and FIG. 2(c) schematically show one preferable method for applying a tension as a result of contraction of the flexible substrate.
Figure 2:
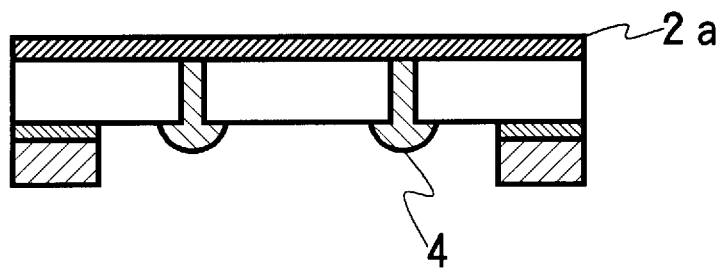
Figure 2:
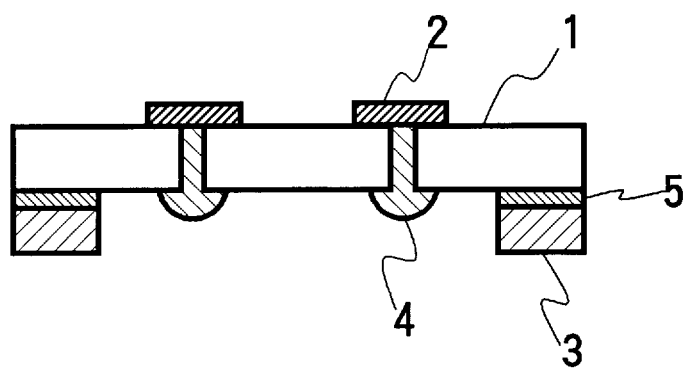

The method schematically shown in FIG. 2 is preferably used for applying tension as a result of shrinkage of the flexible substrate.

As shown in FIG. 2(a), a polyimide precursor is applied to metal foil plate (e.g., copper foil) 2a to be a conductor, and then heated to evaporate the solvent and cure the polyimide. As a result, a laminate of metal foil and flexible substrate 1 is obtained. The flexible substrate tends to shrink with the curing of the polyimide. However, the flexible substrate is hindered by the metal foil and leaves a residual stress inside the flexible substrate, directed toward shrinkage. A rigid substrate 3 is bonded to this laminate by heating. In this embodiment, an adhesive layer 5 is interposed between the flexible substrate and the rigid substrate as in FIG. 1. It is preferable that the rigid substrate be heated at a temperature higher than the glass transition temperature for bonding and that the residual stress in the flexible substrate directed toward shrinkage be made greater.

Next, a bump contact is formed at a predetermined position on the flexible substrate, as shown in FIG. 2(b).

Finally, as shown in FIG. 2(c), the metal foil is partly removed and subdivided in the planar direction to form a circuit pattern, whereby obstacles for shrinking are removed and the residual stress is completely released. With the complete release of the stress, the flexible substrate shrinks and tension is applied to the flexible substrate to give the probe of the present invention.

In this embodiment, however, it is preferable that the amount of shrinkage produced by the curing of the polyimide, which is the material of the flexible substrate, be greater than the shrinkage that is produced when the metal foil is cooled after heating.

When the conductor is a circuit pattern, the conductor is formed such that it corresponds to the position where the bump contact is to be formed, and any desired number of circuits independent from each other may be formed. In other words, the mode of circuit pattern is arbitrarily selected from options comprising a circuit pattern corresponding to respective bump contacts and independent from other circuit patterns, a single conductor layer wherein the entire part is electrically continued, and the like. The circuit pattern becomes a conductor to connect bump contacts with external circuits, such as a connection at the outer periphery of said probe.

Alternatively, the conductor itself may become a bump contact. In this situation, the flexible substrate has bump contacts on both sides.

When the conductor is a circuit pattern, the material of the conductor is preferably copper, nickel, solder, gold, silver, alloys such as alloy 42, phosphorus-bronze, and the like.

The circuit pattern may be formed by a known method such as the subtractive method and the additive method. The subtractive method leaves only circuit patterns by etching a laminate of substrate and conductor. The additive method includes directly drawing a circuit pattern on the substrate by evaporation and the like.

A circuit pattern is formed inside the flexible substrate by forming a circuit pattern on a flexible substrate that is to be used as a base by one the above-mentioned methods, and coating the same with a material having both flexibility and an insulating property. In this case, the material used for the flexible substrate that is to be used as the base and the material that is to be used for the coating may be the same or different.

The rigid substrate may be any as long as it can support the tension in the planar direction (i.e., plane extending direction) to be applied to the flexible substrate.

When the test substrate is an integrated circuit, a linear expansion coefficient of the rigid substrate of 1–8 ppm in the temperature range of 0°–200° C. provides a preferable outer frame for stretching a flexible substrate because the general linear expansion coefficient of silicon in a temperature range of 0°–200° C. is about 3.5 ppm. This frame is subject to fewer dimensional changes relative to the test substrate.

When the elimination of the locational difference between bump contact and contact object is desired, the linear expansion coefficient of the rigid substrate is most preferably set to the linear expansion coefficient of the test substrate. On the other hand, when the locational difference between bump contact and contact object is not to be eliminated, as discussed with regard to the effect above, a material having a suitable linear expansion coefficient relative to that of the test substrate is used.

The material of the rigid substrate is exemplified by ceramics such as alumina, silicon nitride, silicon carbide, and alloys such as alloy 42, and the like.

Figure 3:
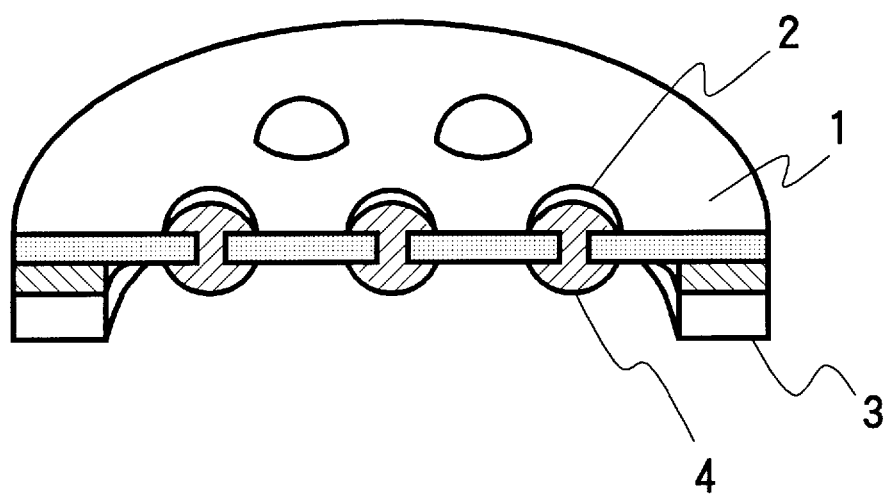
FIG. 3 shows one example of the rigid substrate to be used in the present invention.

The shape of the rigid substrate has no particular limitation as long as it is a frame. However, when the test substrate is a wafer, it is preferably a circular ring frame in view of the disc shape of the wafer and uniformity of the tension. FIG. 3 is a perspective view showing a section of one embodiment thereof. In this embodiment, a rigid circular ring substrate 3 is used as a frame and a flexible substrate 1 is stretched thereon. In this Figure, a conductor 2 and a contact part 4 are both bump contacts.

The junction plane between the rigid frame substrate and the flexible substrate may be a continuous ring or an interrupted frame like a broken line, as long as the flexible substrate can be extended over the inner region enclosed by the frame.

Otherwise, the rigid frame substrate may have a shape identical to the outer shape of the test substrate, where the test substrate is retained and positioned by the outer shape of the test substrate.

The junction between the rigid frame substrate and the flexible substrate may be achieved by any method as long as it involves heating and lamination press. The method may be adhesion using an adhesive, lamination press using heat bonding, a method comprising sandwiching a flexible substrate between a pair of rigid substrates and joining them with a screw before or after heating, or another method.

When an adhesive is used for joining, an adhesive having heat resistance to withstand the high temperature of a burn-in test, such as polyimide adhesives, is particularly preferred.

The method for adhering is a general method wherein a liquid adhesive is applied to other the flexible substrate or the rigid substrate before lamination press, followed by drying, or adhering an adhesive film. In addition, a flexible substrate having a plurality of layers may be used. A thermoplastic polyimide is integrally laminated on the resin layer to be the base of the substrate and used as an adhesive layer, or the resin to be the base of the substrate may be formed from a thermoplastic polyimide and used as an adhesive layer.

Lamination press includes conventional steps. For example, pressure is preferably applied continuously from the application of lamination heat to cooling the adhesion is completed.

The contact part may be any as long as it can be electrically connected to the contact target of the test substrate. In general, it has a protrusion of bump contact (or simply bump) of good conductor metal. The contact part may not necessarily protrude from the flexible substrate surface. It may form the same plane with the flexible substrate or it may be concave depending on the shape of the mating contact part.

The material of the bump contact is exemplified by gold, silver, copper, lead, chromium, zinc, aluminum, nickel, iron, platinum, palladium, rhodium, ruthenium and the like. The bump contact may be made from a single metal or it may be a laminate of different metals. When a laminate of different metals is used, the outermost metal is preferably one having a Knoop hardness of 700–1200 Hk, such as rhodium and ruthenium.

The bump contact is formed to be continuous with the conductor. The bump contact and conductor in a general probe are formed at positions in the front/reverse or surface/deep layer with respect to the flexible substrate where the bump contact and conductor are positioned right below each other, and they are electrically continued through a through-hole formed in the flexible substrate. One example of the configuration method of a bump contact having such a continuous structure is schematically explained below.

As shown in FIG. 1(a), a conductor 2 is formed on either side of flexible substrate 1 or inside thereof. Then, as shown in FIG. 1(c), a through-hole is formed at the position of the conductor (when the conductor is formed inside of the substrate, the position precisely corresponding to the position right above), and the conductor is exposed at the bottom of the inside of the through-hole. Then, the conductor metal that is to be the material of the bump contact is deposited in the through-hole to fill the hole until it protrudes from the surface of the flexible substrate to form a bump contact 4, as is shown in FIG. 1(c).

The through-hole is formed in the flexible substrate by wet etching which comprises chemical etching using chemicals and solvents, or dry etching using a laser (e.g., carbon dioxide gas laser, YAG laser and eximer laser), plasma and the like. When precise microhole forming processing is desired, etching using a laser is preferred.

The order of the processing steps shown in FIG. 1 is not fixed, and they may be performed in a different order. For example, the steps of FIG. 1(a) and FIG. 1(c) may be performed first to complete a general probe, and bonding of the flexible substrate and rigid substrate of FIG. 1(b) may be done as a final step.

When the formation of a bump contact is the final step in the procedure of FIG. 1(a)–FIG. 1(c) and the rigid substrate is used as a positioning frame of the test substrate, the bump contact is preferably formed using the rigid substrate as a reference position.

Other embodiments of the probe to be obtained by the present invention are shown in FIG. 4(a)–FIG. 4(c) and FIG. 5(d)–FIG. 5(f) wherein only the lines visible in the section are shown.

Figure 4:
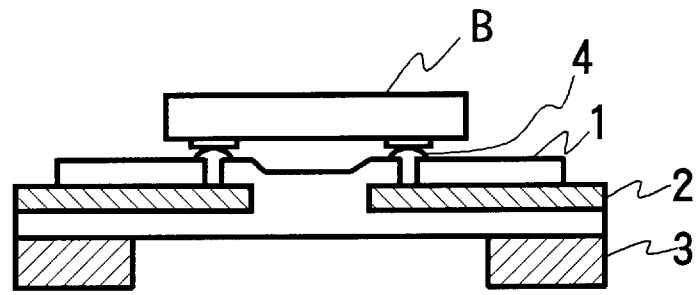
FIG. 4(a), FIG. 4(b) and FIG. 4(c) show one example of the probe manufactured by the present invention.
Figure 4:
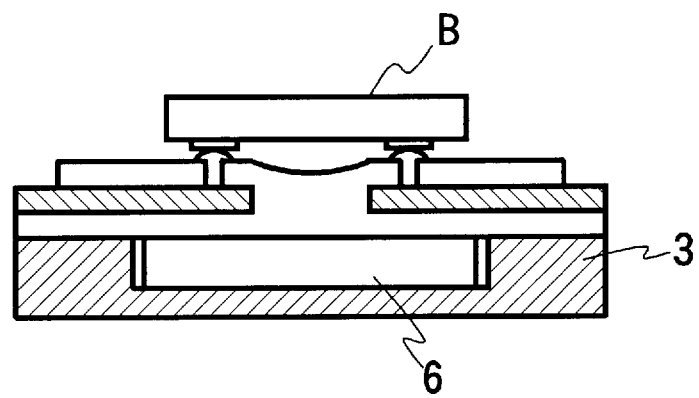
Figure 4:
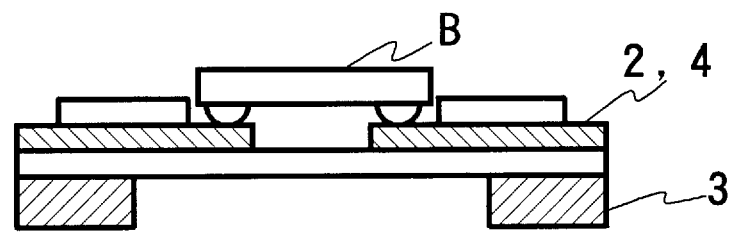

FIG. 4(a) has the same structure as FIG. 1 wherein a rigid substrate 3 is integrally formed on the outer periphery of the flexible substrate 1. B is a test substrate.

FIG. 4(b) shows a frame formed by making a recess in the center of the rigid substrate 3. In this recess, a compliance 6 is set.

FIG. 4(c) shows a bare chip test substrate B which is brought into contact with a solder bump contact. In this embodiment, since the contact target is a protrusion, the contact part 4 on the probe side is a lead, namely, a circuit pattern 2 exposed to give a small flat contact plane.

Figure 5:
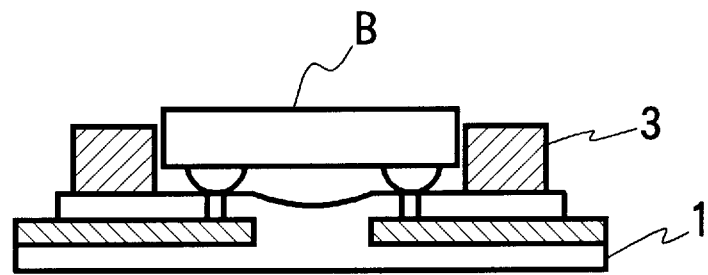
FIG. 5(d), FIG. 5(e) and FIG. 5(f) show another example of the probe manufactured by the present invention.
Figure 5:
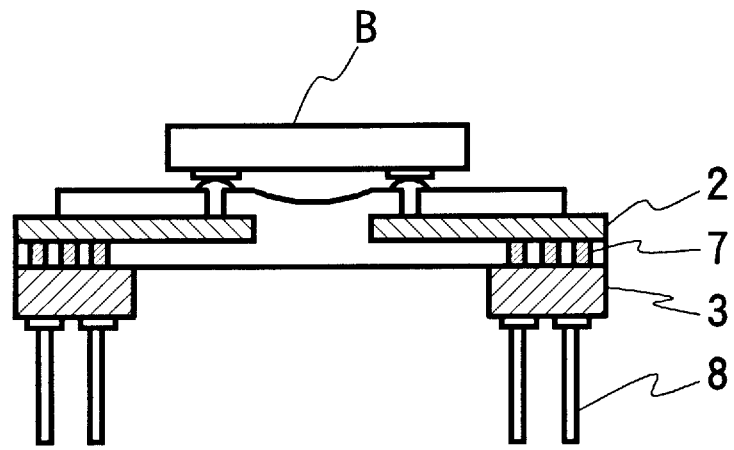
Figure 5:
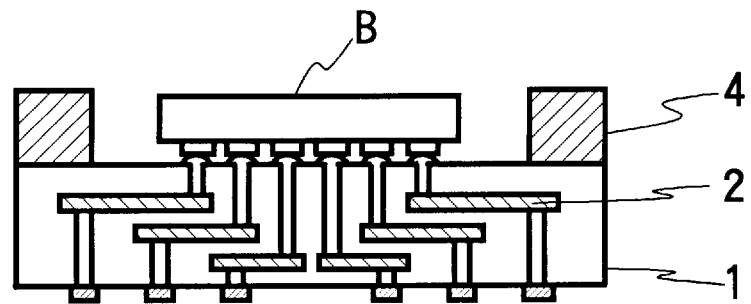

FIG. 5(d) shows a test substrate B which is the same as that in FIG. 4(c). In this embodiment, a rigid substrate 3 is formed on the test substrate side relative to the flexible substrate 1, and the through-hole in the center of the rigid substrate has a shape capable of retaining the test substrate by holding same at its outer periphery. This shape is used as an alignment hole for positioning the test substrate.

FIG. 5(e) shows a rigid substrate having a conductor circuit (not shown) inside of the substrate, and a connector 8 which can be connected to outside equipment. A circuit pattern 2 of the flexible substrate and the conductor circuit inside the rigid substrate are connected via a conductive path 7.

FIG. 5(f) shows an embodiment wherein a rigid substrate is formed on the test substrate side and the flexible substrate is a multi-layer circuit substrate.

The present invention is described more specifically in the following by way of the following examples.

EXAMPLE 1

In this embodiment, a flexible substrate was made to shrink by heating the same for bonding to a rigid substrate.
Preparation of flexible substrate having a conductor layer A polyimide precursor solution (solvent: NMP, N-methyl-2-pyrrolidone) was prepared by polymerization of s-biphenyltetracarboxylic dianhydride (100 moles) with 4,4'-diaminodiphenyl ether (30 moles) and p-phenylenediamine (70 moles). This solution was casted on a copper foil, dried, cured for imidation to give a flexible substrate having a conductor layer (a laminate of copper foil and polyimide film). The linear expansion coefficient of the substrate as a whole was 18 ppm, and that of polyimide film alone was 22 ppm. This polyimide film had a glass transition temperature in the vicinity of 285° C., and shrinkage was 0.6% after heating the film to 300° C.
Formation of circuit pattern A photo resist was applied to the surface of the above-mentioned copper foil, and a predetermined circuit pattern was formed by exposure, developing, copper etching and resist peeling, which pattern being designed to precisely pass the position corresponding to the position where a bump contact was to be formed.
Formation of bump contact A through-hole having an inner diameter of 80 $\mu$m was formed in the polyimide film by irradiation of carbon dioxide gas laser by a mask projection+galvanoscanning method at the position where a bump contact was to be formed, whereby the circuit pattern was exposed at the bottom of the through-hole.

A resist membrane against plating was applied to the surface of the circuit pattern except the portion exposed at the bottom of the through-hole, and Ni was deposited in the through-hole by electroplating using the circuit pattern as a negative electrode to fill the hole. The electroplating was continued to form a protrusion having a height from the surface of the substrate of 20 $\mu$m, and the protrusion was plated with gold in the thickness of 1 $\mu$m, which was followed by rhodium plating in the thickness of 1 $\mu$m and peeling of the resist membrane to give a probe part.
Bonding of flexible substrate and rigid substrate A ring frame (outer diameter 240 mm, inner diameter 220 mm, thickness 1 mm) was formed from ceramic and used as a rigid substrate. The linear expansion coefficient was 7 ppm.

A polyimide adhesive film punched out into a frame product having the same shape with the rigid substrate was interposed between the rigid substrate and the flexible substrate and heated to 200° C. The laminate was bonded by lamination press in the laminating direction to give the probe of the present invention. The lamination conditions were 300° C.×1 hr and 50 kg/cm². The pressure was continuously applied after heating until the completion of cooling.
Properties of probe The flexible substrate of the probe thus stretched, which was enclosed by the rigid substrate, was in tension in the planar direction, and stretched uniformly relative to the rigid substrate.

The linear expansion coefficient of the probe at room temperature—200° C. was determined with respect to the portion of the flexible substrate in tension and found to be 4 ppm.

A 6 inch wafer as a test substrate was brought into close contact with the probe and subjected to a burn-in test at room temperature—150° C. As a result, no trace of dislocation of bump was found at the contact part on the wafer side, and no damage was found on the bump surface.

EXAMPLE 2

In this embodiment, the same steps were involved as in Example 1 except that the circuit pattern was formed inside the flexible substrate, and sizes and materials of respective parts were different.
Formation of circuit pattern In the same manner as in Example 1, a circuit pattern was formed on one side of a flexible substrate, and covered with a polyimide coating except an outside contact terminal.
Formation of bump contact A through-hole having an inner diameter of 30 $\mu$m was formed in the polyimide film by irradiation of an eximer laser (wavelength 248 nm) by a mask projection method at the position where a bump contact was to be formed, whereby the circuit pattern was exposed at the bottom of the through-hole.

A resist membrane against plating was applied to the outside contact terminal of the circuit pattern, and Ni was deposited in the through-hole to fill the hole by electroplating using the circuit pattern as a negative electrode. The electroplating was continued to form a protrusion having a height from the surface of the substrate of 25 $\mu$m, and the protrusion was plated with gold in the thickness of 1 $\mu$m, which was followed by rhodium plating in the thickness of 1 $\mu$m and peeling of the resist membrane to give a probe part.
Bonding of flexible substrate and rigid substrate A rigid substrate made from alloy 42 and having an opening of the size of the test substrate bare chip (outer size 12 mm×7 mm) plus 5 mm circumferential gap was prepared to give a frame of outer size 40 mm×40 mm and thickness 0.5 mm.

A polyimide adhesive film punched out into a frame product having the same shape with the rigid substrate was interposed between the rigid substrate and the flexible substrate, heated, and bonded by lamination press to give the probe of the present invention. The lamination conditions were 180° C.×1 hr and 50 kg/cm². The pressure was continuously applied from initiation of heating to the completion of cooling.
Properties of probe The flexible substrate of the probe thus obtained, which was enclosed by the rigid substrate, was in tension in the planar direction, and stretched uniformly relative to the rigid substrate.

The linear expansion coefficient of the probe at room temperature—200° C. was determined with respect to the portion of the flexible substrate in tension and found to be 6.5 ppm.

A bare chip as a test substrate was brought into close contact with the probe and subjected to a burn-in cycle at room temperature—125° C. As a result, no trace of dislocation of bump was found at the contact point on the bare chip side, and no damage was found on the bump surface.

EXAMPLE 3

In this embodiment, the flexible substrate was made to shrink by heating for joining the flexible substrate and the rigid substrate.
Preparation of flexible substrate having a conductor layer A polyimide precursor solution (solvent: NMP, N-methyl-2-pyrrolidone) was prepared by polymerization of s-biphenyltetracarboxylic dianhydride (100 moles) with 4,4'-diaminodiphenyl ether (30 moles) and p-phenylenediamine (70 moles). This solution was casted on a copper foil, dried, cured for imidation to give a flexible substrate having a conductor layer (a laminate of copper foil and polyimide film).

The linear expansion coefficient of the substrate was 18 ppm and the dimensional shrinkage between before and after complete removal of the copper foil was 0.1%.

This polyimide film had a glass transition temperature in the vicinity of 285° C., and shrinkage was 0.6% after heating the film to 300° C.
Bonding of flexible substrate and rigid substrate A polyimide adhesive film punched out into a frame product having the same shape with the rigid substrate was interposed between a flexible substrate and a ceramic frame formed in outer diameter 240 mm, inner diameter 220 mm and thickness 1 mm and having a linear expansion coefficient of 7 ppm, heated, and bonded by lamination press in the laminating direction to give the probe of the present invention.

The lamination conditions were 250° C.×1 hr and 50 kg/cm². The pressure was continuously applied after heating until the completion of cooling.
Formation of circuit pattern A photo resist was applied to the copper surface of the substrate. Exposure, developing, copper etching and resist peeling gave a predetermined circuit pattern.
Formation of bump contact A through-hole reaching the copper foil was formed in the polyimide film at the predetermined position by the irradiation of carbon dioxide gas laser by a mask projection+galvanoscanning method.

A resist against plating was applied to the opposite side of the copper foil from the polyimide film, and Ni was deposited to fill the through-hole by electroplating. A protrusion having a height of 30 μm was formed, and the protrusion was plated with gold in the thickness of 1 μm, which was followed by rhodium plating in the thickness of 1 μm.
Shrinkage of flexible substrate by heating The obtained substrate was again sandwiched between lamination presses and applied with a pressure. The substrate was heated to 300° C. in this state, cooled to room temperature to make the flexible substrate shrink to apply a tension.
Properties of probe The linear expansion coefficient of the probe at room temperature—200° C. was determined with respect to the polyimide film and found to be 4 ppm.

A 6 inch wafer was brought into close contact with the probe and subjected to a burn-in cycle at room temperature—150° C. As a result, no trace of dislocation of bump was found at the contact part on the wafer side, and no damage was found on the bump surface.

EXAMPLE 4

In this embodiment, the flexible substrate was prohibited from shrinking by the presence of a conductor layer, but allowed to shrink in the final step by etching the conductor.
Formation of flexible substrate having a conductor layer A polyimide precursor solution (solvent: NMP, N-methyl-2-pyrrolidone) was prepared by polymerization of pyrromellitic dianhydride with 4,4'-diaminodiphenyl ether. This solution was casted on a copper foil, dried, cured for imidation to give a flexible substrate having a conductor layer (a laminate of copper foil and polyimide film). The linear expansion coefficient of the substrate was 20 ppm. The shrinkage was 0.4% between before and after complete removal of copper foil of the substrate by etching.
Bonding of flexible substrate and rigid substrate A polyimide adhesive solution was applied to one side of a ceramic frame formed in outer diameter 240 mm, inner diameter 220 mm and thickness 1 mm and having a linear expansion coefficient of 7 ppm and dried. After heating the above-mentioned flexible substrate, the frame was bonded by lamination press. The lamination conditions were 250° C.×1 hr and 20 kg/cm². The pressure was continuously applied after heating until the completion of cooling.
Formation of bump contact A through-hole reaching the copper foil was formed in the flexible substrate at the predetermined position by irradiation of an eximer laser (wavelength 248 nm) by a mask projection method.

A resist against plating was applied to the surface of the copper foil except the inside of the through-hole, and Ni and then gold were successively plated inside the through-hole by electroplating. A protrusion having a height of 20 μm was formed, and the protrusion was plated with gold in the thickness of 1 μm.
Formation of circuit pattern The copper foil was all removed except the circuit pattern by alkali etching to release all shrinking stress which remained inside the flexible substrate and to allow the flexible substrate to shrink, whereby a desired probe was obtained.
Properties of probe The linear expansion coefficient of the probe at room temperature—200° C. was determined and found to be 7 ppm.

A 6 inch wafer was brought into close contact with the probe and subjected to a burn-in cycle at room temperature—150° C. As a result, no trace of dislocation of bump was found at the contact point on the wafer side, and no damage was found on the bump surface.

Comparative Example 1

In the same manner as in Example 2 except that a glass epoxy substrate was used instead of alloy 42 as a rigid substrate, a probe was obtained. The flexible substrate of the obtained probe was corrugated and free of stress.

A bare chip was brought into close contact with the probe and subjected to a burn-in cycle at room temperature—125° C. As a result, a flaw caused by the bump which moved several dozen μm was found in the pad portion of the chip.

What is claimed is:

1. A method for fabrication of a probe, comprising the steps of:

(a) forming a conductive layer on one side of an insulating flexible substrate;

(b) bonding said flexible substrate to a rigid frame substrate capable of supporting, at the outer periphery thereof, a tension in the plane of said flexible substrate;

(c) heating the flexible substrate to generate, in the flexible substrate, a residual stress toward shrinkage; and (d) then processing the conductive layer into a circuit pattern, thus removing portions of said conductive layer and eliminating an obstacle to shrinkage, thereby applying a planar tension to the flexible substrate.

2. The fabrication method of claim 1, further comprising a step of forming, on the other side of the flexible substrate, a contact part conducting with the conductive layer through the flexible substrate.

3. The fabrication method of claim 1, wherein the insulating flexible substrate is made from a polyimide resin and the conductive layer is formed on one side of said flexible substrate by casting a polyimide precursor solution on the conductive layer.

4. The fabrication method of claim 3, wherein the heating makes the flexible substrate tend to shrink by evaporating the solvent in the polyimide precursor solution, thereby curing the polyimide.

5. The fabrication method of claim 1, wherein the rigid frame substrate is made from a material that has a linear expansion coefficient which is the same as that of a test substrate of the probe.

6. The fabrication method of claim 1, wherein the rigid frame substrate has a shape that is a frame having, at the center thereof, an opening capable of supporting and positioning a test substrate of the probe at a testing position.

7. The fabrication method of claim 1, wherein a test substrate of the probe has a disk shape.

8. The fabrication method of claim 1, wherein a test substrate of the probe is an integrated circuit having a linear expansion coefficient which is the same as that of silicon in a temperature range of from 0° C. to 200° C. and the rigid frame substrate has a linear expansion coefficient of 1 ppm–8 ppm in this temperature range.

* * * * *